United States Patent
Murayama et al.

(10) Patent No.: US 9,059,429 B2
(45) Date of Patent: Jun. 16, 2015

(54) MANUFACTURING METHOD FOR ORGANIC ELECTROLUMINESCENT PANEL AND ORGANIC ELECTROLUMINESCENT PANEL MANUFACTURED USING THE SAME

(75) Inventors: Masaaki Murayama, Hachioji (JP); Nobuaki Takahashi, Tama (JP); Daisuke Numakura, Tokyo (JP)

(73) Assignee: KONICA MINOLTA HOLDINGS, INC., Tokyo (JP)

( * ) Notice: Subject to any disclaimer, the term of this patent is extended or adjusted under 35 U.S.C. 154(b) by 246 days.

(21) Appl. No.: 13/640,355

(22) PCT Filed: Apr. 18, 2011

(86) PCT No.: PCT/JP2011/059509
§ 371 (c)(1),
(2), (4) Date: Oct. 10, 2012

(87) PCT Pub. No.: WO2011/132631
PCT Pub. Date: Oct. 27, 2011

(65) Prior Publication Data
US 2013/0026910 A1    Jan. 31, 2013

(30) Foreign Application Priority Data

Apr. 21, 2010   (JP) .................. 2010-097539

(51) Int. Cl.
*H01J 9/00*     (2006.01)
*H01L 51/52*    (2006.01)
(52) U.S. Cl.
CPC .................. *H01L 51/5246* (2013.01)
(58) Field of Classification Search
USPC .................................... 445/23–25
See application file for complete search history.

(56) References Cited

U.S. PATENT DOCUMENTS

| | | |
|---|---|---|
| 2003/0019572 A1 | 1/2003 | Low et al. |
| 2009/0243474 A1 | 10/2009 | Kase et al. |
| 2010/0035505 A1 | 2/2010 | Ishii et al. |

FOREIGN PATENT DOCUMENTS

| | | | |
|---|---|---|---|
| JP | 2000-150147 A | 5/2000 | |
| JP | 2002-373777 A | 12/2002 | |

(Continued)

OTHER PUBLICATIONS

International Search Report dated May 24, 2011 issued in International Appln. No. PCT/JP2011/059509.

(Continued)

*Primary Examiner* — Joseph L Williams
(74) *Attorney, Agent, or Firm* — Holtz, Holtz, Goodman & Chick PC

(57) ABSTRACT

A simple manufacturing method for an organic electroluminescent panel in which organic electroluminescent elements are arranged and sealed by a sealing adhesive. The electroluminescent panel has excellent sealing properties and excellent durability as a result of the organic electroluminescent elements being adhered to one another by a heat-curable adhesive. The manufacturing method is for an organic electroluminescent panel in which at least a first electrode, an organic functional layer containing a light-emitting layer, an organic electroluminescent element having a second electrode, and a sealing substrate are bonded together on a substrate by the heat-curable adhesive. The method includes forming a heat-curable adhesive layer on the sealing substrate, subjecting the heat-curable adhesive layer formed on the sealing substrate to pre-heating treatment, bonding the pre-heated heat-curable adhesive layer to the organic electroluminescent element, and subjecting the heat-curable adhesive layer to heat curing, in the given order.

8 Claims, 4 Drawing Sheets

(56) References Cited

FOREIGN PATENT DOCUMENTS

| | | |
|---|---|---|
| JP | 2006-269247 A | 10/2006 |
| JP | 2008-65994 A | 3/2008 |
| JP | 2009-123532 A | 6/2009 |

OTHER PUBLICATIONS

Japanese Office Action dated Jul. 3, 2014 issued in counterpart Japanese Application No. 2012-511647.

Extended European Search Report (EESR) dated Mar. 23, 2015 issued in counterpart European Application No. 11771966.6.

MANUFACTURING METHOD FOR ORGANIC ELECTROLUMINESCENT PANEL AND ORGANIC ELECTROLUMINESCENT PANEL MANUFACTURED USING THE SAME

This application is a U.S. National Phase Application under 35 USC 371 of International Application PCT/JP2011/059509 filed Apr. 18, 2011.

TECHNICAL FIELD

The present invention relates to a manufacturing method for an organic electroluminescent panel and in particular, to a sealing method of an organic electroluminescent panel in manufacturing of an organic electroluminescent panel.

BACKGROUND ART

Over recent years, organic electroluminescent elements (thereinafter, also referred to simply as organic EL elements) employing organic materials have been regarded as promising in use as thin, inexpensive large-area full-color display elements of a solid light-emitting type and light source arrays, and therefore active research and development are being conducted.

An organic EL element is a thin film-type element having a first electrode (anode or cathode) formed on a substrate, an organic compound layer (single layer or multilayer), i.e., a light-emitting layer containing an organic luminescent material layered thereon, and a second electrode (cathode or anode) layered on this light-emitting layer. When a voltage is applied to such an organic EL element, electrons are injected into the organic compound layer from the cathode and at the same time, positive holes are injected from the anode. It is known that these electrons and positive holes are recombined in the light-emitting layer and then energy is emitted as light when the energy level returns from the conduction band to the valence band for luminescence from the light-emitting layer.

However, an organic material such as an organic luminescent material used for an organic EL element is vulnerable to moisture and oxygen and tends to degrade in performance due to the moisture and oxygen. Further, since characteristics of an electrode are also degraded drastically in air due to oxygen, generally, a method, in which a sealing layer is provided for the uppermost layer to shield moisture and oxygen in air for prevention of such degradation, is employed.

A number of sealing methods of an organic EL element have been investigated so far, being roughly categorized into a casing-type sealing method and a contact-type sealing method.

The casing-type sealing method is a sealing method, in which an organic EL element is placed in a case to be shielded from the outside and then a certain sealing gas or fluid is filled in the case together with the organic EL element.

On the other hand, the contact-type sealing method is a sealing method using a substrate and a sealing base material, in which the element surface of an organic EL element formed on a substrate is subjected to surface adhesion to a sealing base material such as a glass plate using an adhesive.

In the case of the casing-type sealing method, since a sealing gas or fluid is filled in a case, there have been noted problems such as no possibility of forming a thin type, complicated steps, and unsuitability for mass production.

On the other hand, the contact-type sealing method has advantages such as possibility of responding to a thin type and relative ease of mass production, and therefore, investigations thereon have been conducted in recent years In the contact-type sealing method, for example, an organic EL element sealed by a sealing film containing a barrier layer and a sealant layer incorporating a thermoplastic adhesive resin is known (for example, refer to Patent Document 1).

Further, in a method using a curable adhesive instead of a thermoplastic adhesive resin, heat-curable and UV-curable adhesives are known. In such a UV-curable adhesive, UV radiation is irradiated to cure an adhesive, and therefore, it is necessary that the substrate irradiation surface be transparent and an irradiated material be one being hardly damaged via UV irradiation. Therefore, the application range has been limited.

In view of these problems, a number of methods employing a heat-curable adhesive have been used because of their advantages in handling and convenience as a manufacturing apparatus.

However, as a problem of a heat-curable adhesive, the following has been found: such an adhesive itself has hygroscopic properties and its moisture content increases with a poor control and storage method; and a sealing member thermally cured using the adhesive becomes problematic in sealing characteristics thereafter.

Therefore, to solve such problems, there are proposed methods in which all members used for sealing are stored in a sealed container of low humidity and low dew point under reduced pressure for dehydration treatment (for example, refer to Patent Documents 1 and 2).

However, such methods require huge storage facilities and thereby cost increase has resulted.

Dehydration of a heat-curable adhesive using a simple method results in a large advantage. As a method of dehydration using a simple method, heating is cited. However, in this method, curing of an adhesive itself is allowed to advance and then its adhesion function is lost. Therefore, it is recognized that any heating method is a method which should be avoided, and then various other methods have been investigated. However, currently, no good method has been found out yet.

In view of such current situations, in a manufacturing method for an organic EL panel in which an organic electroluminescent element is sealed using a sealing method by use of bonding via an adhesive, it has been strongly desired that a manufacturing method for an organic EL panel, in which a simple method is employed and no degradation of the sealing performance occurs even when a sealing substrate is fixed using a heat-curable adhesive and an organic EL panel are developed.

Herein, in the present invention, a state where a first electrode, an organic layer, and a second electrode have been formed on a substrate is referred to as an organic EL element and a state where contact sealing has been carried out using a sealing substrate is referred to as an organic EL panel.

PRIOR ART DOCUMENTS

Patent Documents

Patent Document 1: Unexamined Japanese Patent Application Publication No. 2000-150147
Patent Document 2: Unexamined Japanese Patent Application Publication No. 2002-373777

BRIEF DESCRIPTION OF THE INVENTION

Problems to be Solved by the Invention

In view of the above situation, the present invention was completed and an object thereof is to provide a manufacturing method for an organic EL panel in which an organic EL element is sealed using an adhesive, wherein excellent sealing performance and durability are expressed by adhesion using a heat-curable adhesive via a simple method.

Means to Solve the Problems

The object of the present invention was achieved by the following constitution.

1. A manufacturing method for an organic electroluminescent panel in which an organic electroluminescent element including at least a first electrode, an organic functional layer containing a light-emitting layer, and a second electrode on a substrate and a sealing substrate are bonded via a heat-curable adhesive layer, wherein a step of forming the heat-curable adhesive layer on the sealing substrate, a step of preheating the heat-curable adhesive layer formed on the sealing substrate, a step of bonding the preheated heat-curable adhesive layer and the organic electroluminescent element, and a step of curing/heating the preheated heat-curable adhesive layer are provided in this order.

2. The manufacturing method for an organic electroluminescent panel described in item 1, wherein in the pre-heating step, the curing degree of the heat-curable adhesive layer after preheating is at most 50%.

3. The manufacturing method for an organic electroluminescent panel described in item 1 or 2, wherein in the pre-heating step, the moisture content of the heat-curable adhesive layer after preheating is at most 500 ppm.

4. The manufacturing method for an organic electroluminescent panel described in any one of items 1 to 3, wherein in the preheating step, the moisture content of the heat-curable adhesive layer prior to preheating is at least 2000 ppm.

5. The manufacturing method for an organic electroluminescent panel described in any one of items 1 to 4, wherein the preheating step is performed in an inert gas environment.

6. The manufacturing method for an organic electroluminescent panel described in any one of items 1 to 5, wherein the preheating step is performed at a dew point of at most −30° C.

7. The manufacturing method for an organic electroluminescent panel described in any one of items 1 to 6, wherein the preheating step is performed at 1000 Pa or less.

8. The manufacturing method for an organic electroluminescent panel described in any one of items 1 to 7, wherein the preheating step and the bonding step are arranged in the same space and continuously performed.

9. The manufacturing method for an organic electroluminescent panel described in any one of items 1 to 8, wherein the substrate is a belt-shaped flexible substrate; and a step of preheating, a step of bonding, and a step of thermally curing a heat-curable adhesive layer are performed using a continuous roll-to-roll system.

10. An organic electroluminescent panel formed by a manufacturing method for an organic electroluminescent panel described in any one of items 1 to 9.

Effects of the Invention

The manufacturing method of the present invention made it possible to provide an organic electroluminescent panel exhibiting excellent durability using a simple method.

PREFERRED EMBODIMENT OF THE INVENTION

An embodiment to carry out the present invention will now be described in detail.

In view of the above problems, the present inventors conducted diligent investigations and thereby, found out the following to achieve the present invention: in a manufacturing method for an organic EL panel in which an organic EL element including at least a first electrode, an organic functional layer containing a light-emitting layer, and a second electrode on a substrate and a sealing substrate were bonded via a heat-curable adhesive layer, a manufacturing method for an organic EL panel in which a step of forming the heat-curable adhesive layer on the sealing substrate, a step of preheating a heat-curable adhesive layer formed on the sealing substrate, a step of bonding the preheated heat-curable adhesive layer and an organic electroluminescent element, and a step of thermally curing/heating the heat-curable adhesive layer were provided in this order was able to realize a manufacturing method for an organic EL panel with simplicity in which the organic functional layer performance was inhibited from degrading and especially, over-time degradation was minimized.

The bonding step of an organic EL panel and a sealing member used in the present invention will be described with reference to the drawings.

Figure 1A:
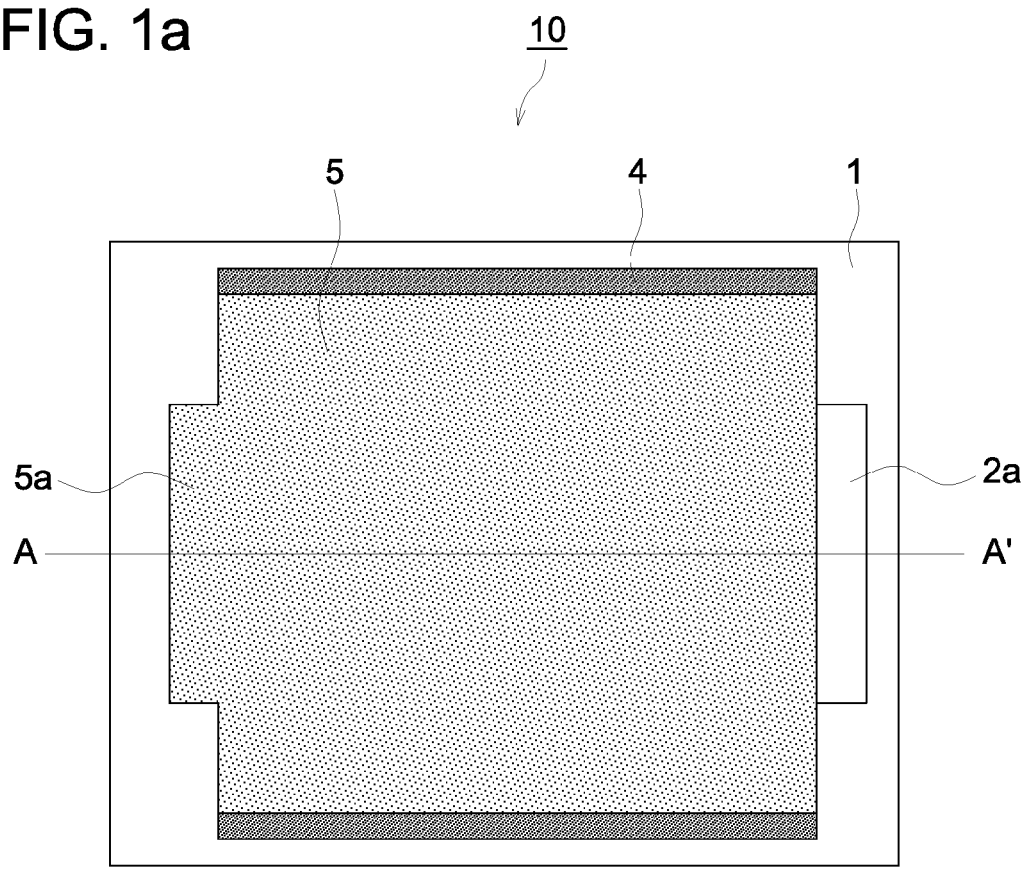
FIGS. 1a and 1b show a plan view and a cross-sectional view of an organic EL panel formed into a sheet.
Figure 1B:
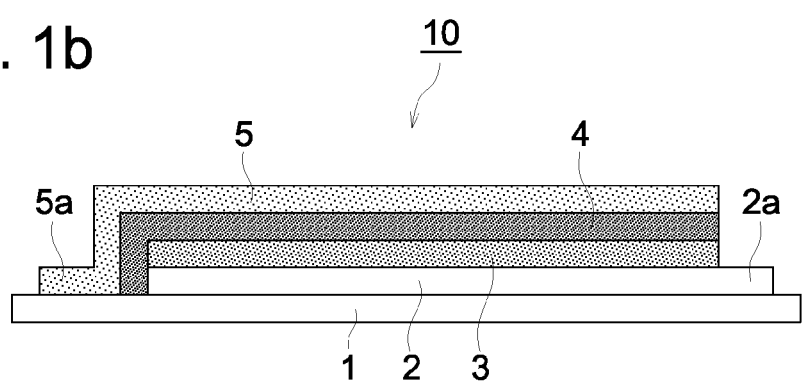

FIG. 1a shows a plan view of an organic EL panel formed into a sheet and FIG. 1B shows a cross-sectional view of the organic EL panel taken along line A-A' in FIG. 1A.

In FIGS. 1a and 1b, a first electrode 2 is provided on a substrate 1 and thereon, as organic functional layers, a hole transporting layer 3 and a light-emitting layer 4 are provided. Further, thereon, as a cathode, a second electrode 5 is layered. At the end portions of the first electrode 2 and the second electrode 5 each, terminal areas 2a and 5a are provided.

Figure 2A:
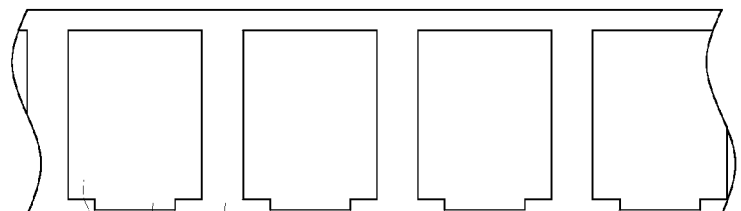
FIGS. 2a-2e show plan views and a cross-sectional view of a plurality of organic EL panels continuously formed on a continuous sheet.
Figure 2B:
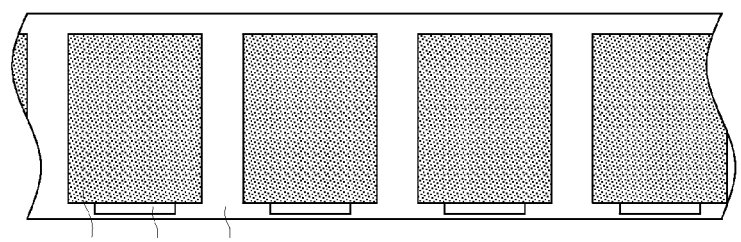
Figure 2C:
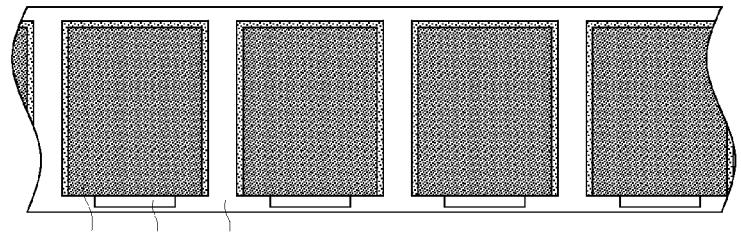
Figure 2D:
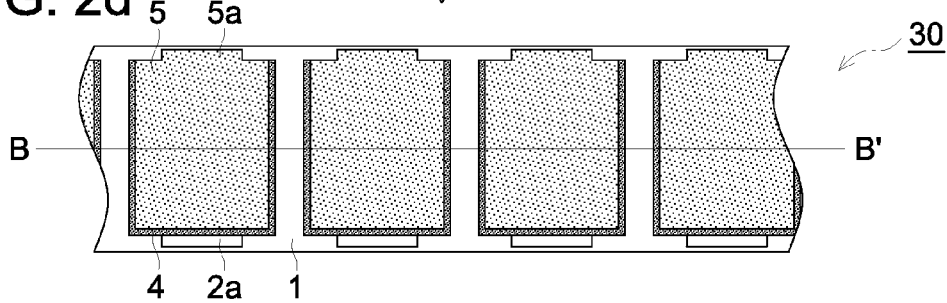
Figure 2E:
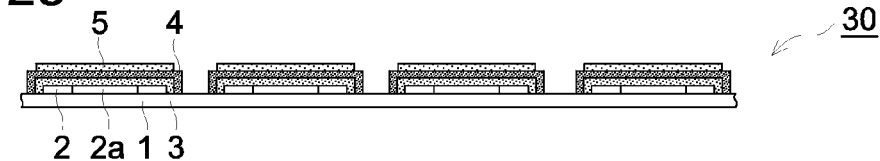

FIGS. 2a-2d show plan views illustrating a process to continuously form a plurality of organic EL elements on a continuous sheet and FIG. 2d shows a cross-sectional view taken along line B-B' in FIG. 2d. The layer configuration is the same as the sheet-fed configuration shown in FIGS. 1a and 1b.

FIGS. 3a-3e illustrate a manufacturing example of the organic EL panel of the present invention using a sheet-fed process.

Figure 3A:
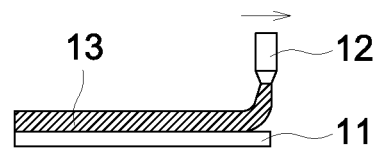
FIGS. 3a-3e show a manufacturing example of an organic EL panel using a sheet-fed process in the adhesion sealing of the present invention.
Figure 3B:
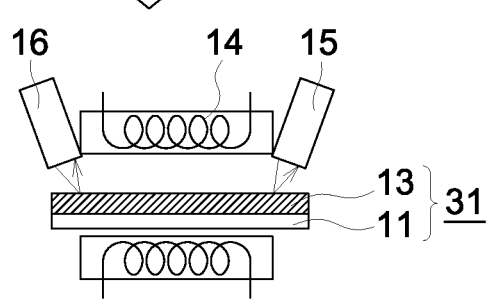

In FIG. 3a, on a sealing substrate 11, a heat-curable adhesive layer 13 is formed using an adhesive coating apparatus 12, and in FIG. 3b, the heat-curable adhesive layer 13 is heated and dehydrated using a heating apparatus 14.

Using an IR absorption measurement device 15 and a moisture measurement device 16, the curing degree and the moisture content of the adhesive layer are determined.

Figure 3C:
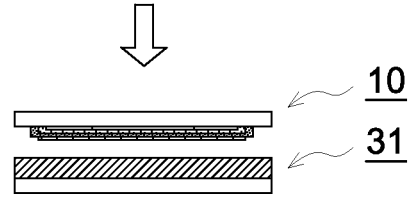
Figure 3D:
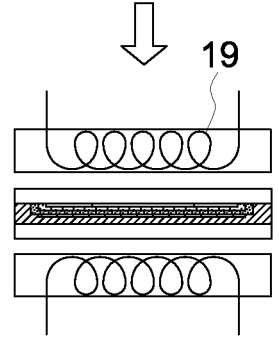
Figure 3E:
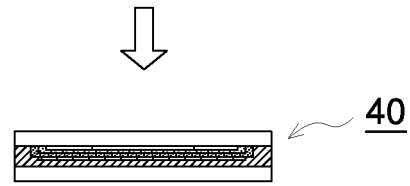

In the range where the curing degree of the heat-durable adhesive layer is preferably at most 50%, preheating is carried out for dehydration; in FIG. 3c, bonding is carried out in the direction facing the sheet-shaped organic EL element 10 shown in FIGS. 1a and 1b; and after pressure bonding (3d), curing/heating treatment is carried out (3e) and then the adhesive layer is thermally cured to form an organic EL panel 40.

Figure 4:
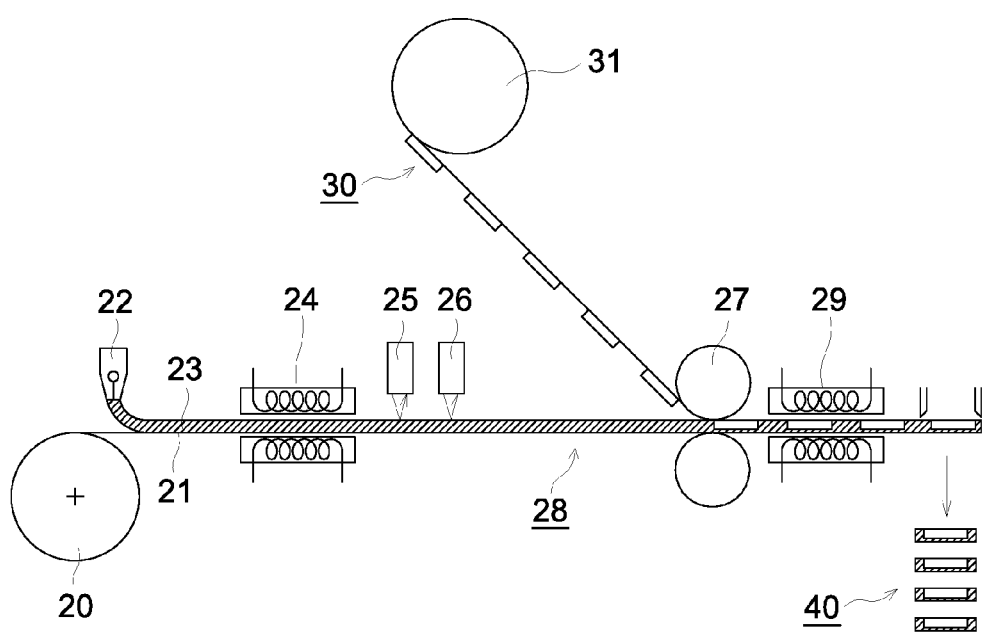
FIG. 4 illustrates a manufacturing example of an organic EL panel using a roll-to-roll (R to R) process in the adhesion sealing of the present invention.

FIG. 4 is a view illustrating a manufacturing example of the organic EL panel of the present invention using a roll-to-roll (R to R) system.

In FIG. 4, on a sealing substrate 21 wound out from the roll 20, a heat-curable adhesive layer 23 is coated using a coating apparatus 22 and the thus-coated heat-curable adhesive layer 23 is preheated and dehydrated using a heating apparatus 24.

The moisture content and the curing degree of the thus-dehydrated heat-curable adhesive layer are determined using a moisture measurement device 25 and an IR absorption measurement device 26.

An organic EL element substrate 30, in which an organic EL element was previously formed on a substrate, wound out from the roll 31 and a dehydrated sealing member 28 (a sealing substrate 21 and an adhesive layer 23) are bonded together using a laminate roll 27, followed by curing/heating to thermally cure the heat-curable adhesive layer. Further, cutting for an individual organic EL element is carried out to form organic EL panels 40.

Herein, in the present invention, it is possible that on a sealing substrate, a heat-curable adhesive layer is formed and then temporarily wound as a sealing member; and the sealing member is wound out from the roll, followed by preheating for dehydration to carry out adhesion bonding to an organic EL element substrate. The preheating step and the organic EL element bonding step are preferably continued. The continuous step referred to here means that with no winding, a roll is continuously conveyed, being possibly a step in which operations are performed in the same space, i.e., in the same ambience or in continuous different ambiences. The same ambience means that, for example, operations are performed in the same chamber.

<Sealing Substrate>

The sealing substrate used in the present invention is not specifically limited to a glass substrate, a plastic material, a metal plate, or a metal foil.

As plastic materials employable in the present invention, usable are thermoplastic resin film materials such as, e.g., ethylene-tetrafluoroethylene copolymers (ETFE), high density polyethylene (HDPE), oriented polypropylene (OPP), polystyrene (PS), polymethyl methacrylate (PMMA), oriented nylon (ONy), polyethylene terephthalate (PET), polyethylene naphthalate (PEN), polycarbonate (PC), polyimide, or polyether styrene (PES). Further, any of these thermoplastic resin film materials can be naturally used as a multilayer film prepared by co-extrusion with a different type film and as a multilayer film prepared by bonding as appropriate. Further, to achieve required physical properties, it is possible to prepare a film by combining different film density and molecular weight distribution.

In use as a sealing substrate, a plastic film to be used preferably has a gas barrier layer.

With respect to characteristics of such a gas barrier layer, the moisture vapor transmission rate is preferably at most 0.01 g/m²·day. The moisture vapor transmission rate represents a value determined mainly using a MOCON method conforming to JIS K7129B method (1992).

The oxygen transmission rate is preferably at most 0.01 ml/m²·day atm. The oxygen transmission rate represents a value determined mainly using a MOCON method conforming to JIS K7126B method (1987).

As the gas barrier layer, an inorganic deposition film and a metal foil are cited. The inorganic deposition film includes inorganic films as described in Thin Film Handbook, pp. 879-901 (Japan Society for Promotion of Science); Vacuum Technology Handbook, pp. 502-509, p. 612, and p. 810 (The Nikkan Kogyo Shimbun Ltd.); and Vacuum Handbook, enlarged and revised edition, pp. 132-134 (ULVAC, Inc.).

For example, metals such as In, Sn, Pb, Au, Cu, Ag, Al, Ti, and Ni; and MgO, SiO, $SiO_2$, $Al_2O_3$, GeO, NiC, CaO, BaO, $Fe_2O_3$, $Y_2O_3$, $TiO_2$, $Cr_2O_3$, $Si_xO_y$ (x=1, y=1.5 to 2.0), $Ta_2O_3$, ZrN, SiC, TiC, PSG, $Si_3N_4$, SiN, single crystal Si, amorphous Si, and W are used.

Further, as the metal foil material, for example, a metal material such as aluminum, copper, or nickel and an alloy material such as stainless steel or aluminum alloy are used. However, in view of workability and cost, aluminum is preferable.

The glass substrate is not specifically limited, including, for example, silicate glass, alkali silicate glass, alkali lead glass, soda-lime glass, potash-lime glass, barium glass, borosilicate glass, and phosphate glass.

<<Heat-Curable Adhesive Layer and Forming Method Therefor>>

In the manufacturing method for an organic EL panel of the present invention, a heat-curable resin used for a heat-curable adhesive layer includes an epoxy resin, an acrylic resin, and a silicone resin but the present invention is not limited thereto. Of these heat-curable resins, from the viewpoint of exhibiting excellent moisture resistance and water resistance and less contraction during curing, an epoxy-based heat-curable resin is preferably used. Further, the thickness of the heat-curable resin layer is about 5 μm to 100 μm, preferably 10 μm to 50 μm.

As the forming method for a heat-curable adhesive layer, employable is a coating method or a printing method such as roll coating, spin coating, screen printing, spray coating, or ink-jet coating, depending on a material to be used.

<<Preheating and Curing/Heating Methods for Adhesive Layer>>

The heating method in preheating and curing/heating for an adhesive layer includes a non-contact type in which heating is carried out with no contact with an adhesive layer and a contact type (the rear surface) in which heating is carried out with contact with an adhesive layer with no specific limitation, but the con-contact type is preferable in view of adverse effects on an organic functional material to form an organic EL element and foreign substance generation.

Herein, in the present invention, preheating refers to heating prior to bonding of a heat-curable adhesive layer and an organic EL element, and curing/heating refers to heating after bonding of the heat-curable adhesive layer and the organic EL element.

As the non-contact heating type, for example, heating methods employing a far-infrared heater, a halogen lamp heater, a laser, and a microwave heater are listed with no limitation thereto.

Lasers being heating members applicable to the present invention can include laser beams such as, for example, neodymium lasers, YAG lasers, ruby lasers, helium-neon lasers, krypton lasers, argon lasers, $H_2$ lasers, $N_2$ lasers, and semiconductor lasers. As more preferable lasers, YAG:$Nd^{3+}$ lasers (laser radiation wavelength: 1060 nm) and semiconductor lasers (laser radiation wavelength: 500 to 1000 nm) can be listed. The power output of laser radiation is preferably 5 to 1000 W.

Such a laser may have a continuous wavelength or a pulse wave. With control of the width of a pulse wave, warming can be adjusted and then optimum conditions are easy to determine.

Further, in the case of consideration of dust generation and a temperature increase in the ambience, a far-infrared heater is preferable.

As the contact heating type, for example, a heating plate is employable. Herein, the heating plate is configured in such a manner that on a SUS foil carrying a heat-producing electrically resistant body formed of a silicon rube heater, an insulating layer is coated and thereon, an aluminum plate and further a fluorine resin are coated to produce heat via electrical power supply from a power source, and thereby an adhesive layer is heated at a desired temperature and dehydrated.

Further, a heating roller being another contact heating type is configured with a roller using a metal with large heat conductivity (e.g., aluminum, stainless steel, iron, or copper) or a plastic material (e.g., bakelite) in which in its central portion, a temperature-controllable heat source (e.g., a metal resistant heat producing body or a halogen lamp) is mounted to heat the outer peripheral portion, and the most outer peripheral portion is covered with TEFLON (a registered trademark) or silicon rubber to appropriately heat the periphery for dehydration.

In the present invention, with respect to conditions for preheating and curing/heating of a heat-curable adhesive layer, the heating temperature is about 50° C. to 200° C., preferably 80° C. to 160° C., specifically preferably 90° C. to 140° C.

In the present invention, heating in the range of a heating time of about 1 second to 30 minutes promotes dehydration and curing (cross-linking reaction), and therefore, in preheating, the treatment time is adjusted to achieve the following preferable moisture content. Heating is preferably carried out for 4.0 seconds to 600 seconds.

<Moisture Content of Heat-Curable Adhesive Layer>

The moisture contents of a heat-curable adhesive layer coated and formed and the adhesive layer preheated can be determined using a Karl Fischer moisture meter (CA-200, produced by Mitsubishi Chemical Analytech Co., Ltd.). The moisture content of a heat-curable adhesive layer prior to preheating is at least 2000 ppm in many cases. Preheating allows the moisture content of the heat-curable adhesive layer to be preferably at most 500 ppm, more preferably at most 300 ppm.

<Curing Degree of Heat-Curable Adhesive Layer>

Incidentally, the curing degree of a heat-curable adhesive layer was determined as described below.

As the measurement device, for example, an FT-IR device (produced by Bio-Rad Laboratories, Inc.) can be used, since determination is preferably carried out non-destructively via real time FT-IR measurement.

The measurement wavelength of a heat-curable adhesive can be changed depending on the type of functional group thereof. For example, in the case of an epoxy-based heat-curable adhesive layer, with respect to changes of the peak intensity at 930 nm, the initial state prior to curing reaction is designated as 0 and then the state where reactive groups have been almost completely consumed and the intensity of a reactive group-derived peak will not be decreased (or be 0) is designated as 100 to calculate the curing degree.

In the present invention, in preheating, heating is preferably carried out so that the curing degree of the heat-curable adhesive layer is at most 50%. Such heating makes it possible to adequately ensure the adhesion performance of the heat-curable adhesive layer.

Next, the organic EL panel of the present invention and the forming method therefor will now be described.

<Organic EL Panel>

Examples of the layer configuration of an organic EL panel sealed and formed by applying the present invention are listed below.

(1) Substrate/anode (first electrode)/light-emitting layer/electron transporting layer/cathode (second electrode)/sealing substrate (2) Substrate/anode (first electrode)/hole transporting layer/light-emitting layer/cathode (second electrode)/sealing substrate (3) Substrate/anode (first electrode)/hole transporting layer/light-emitting layer/hole inhibiting layer/electron transporting layer/cathode (second electrode)/sealing substrate (4) Substrate/anode (first electrode)/hole transporting layer/light-emitting layer/hole inhibiting layer/electron transporting layer/cathode buffer layer (electron injecting layer)/cathode (second electrode)/sealing substrate (5) Substrate/anode (first electrode)/anode buffer layer (hole injecting layer)/hole transporting layer/light-emitting layer/hole inhibiting layer/electron transporting layer/cathode buffer layer (electron injecting layer)/cathode (second electrode)/sealing substrate Herein, in the above layer configurations, organic EL elements having each functional layer formed on the substrate except the sealing substrate are previously fabricated and prepared prior to the sealing step of the present invention.

<Organic EL Element>

In an organic EL element, its anode (first electrode) side is commonly allowed to be the viewing side and as the anode (first electrode), a transparent electrode such as ITO (a mixture of tin oxide and indium oxide), IZO (a mixture of zinc oxide and indium oxide), ZnO, $SnO_2$, or $In_2O_3$ is used. Of these, an ITO electrode can have a large optical transmittance of at least 90% and a small sheet resistance of at most 10Ω/□, being therefore used in the present invention preferably. Further, an IZO electrode is preferable since the electrode is advantageous in having a prescribed small resistance value with no heating of a substrate at the time of formation thereof and in having a smoother film surface than an ITO electrode.

On the anode, each organic functional layer is formed and further thereon, a cathode is formed to form an organic EL element.

As organic materials used for hole injecting/inhibiting layers, polymer materials such as conductive polymers represented by phthalocyanine derivatives, heterocyclic azoles, aromatic tertiary amines, polyvinyl carbazole, and polyethylene dioxythiophene/polystyrene sulfonate (PEDOT: PSS) are used.

Further, those used for the light-emitting layer include, for example, low-molecular luminescent materials represented by carbazole-based luminescent materials such as 4,4'-dicarbazolyl biphenyl and 1,3-dicarbazolylbenzene, (di)azacarbazoles, and pyrene-based luminescent materials such as 1,3,5-tripyrenylbenzene; and polymer luminescent materials represented by polyphenylene vinylenes, polyfluorenes, and polyvinylcarbazoles. Of these, as the luminescent material, a low-molecular luminescent material of a molecular weight of at most 10,000 is preferably used.

Still further, the light-emitting layer may contain a dopant at about 0.1 to 20% by mass as a luminescent material. Such a dopant includes well-known fluorescent dyes such as perylene derivatives or pyrene derivatives, phosphorescent dyes, and complex compounds such as ortho-metalated iridium complexes represented by, for example, tris-2-(phenylpyridine)iridium, bis(2-phenylpyridine)(acetylacetonate) iridium, and bis(2,4-difluorophenylpyridine)(picolinate) iridium.

Electron injecting/transporting materials include metal complex compounds such as 8-hydroxyquinolinate lithium or bis(8-hydroxyquinolinate) zinc and the following nitrogen containing-five membered cyclic derivatives: namely, derivatives of oxazole, thiazole, oxadiazole, thiadiazole, or triazole are preferable. Specific examples include 2,5-bis(1-phenyl)-1,3,4-oxazole, 2,5-bis(1-phenyl)-1,3,4-thiazole, 2,5-bis(1-phenyl)-1,3,4-oxadiazole, 2-(4'-tert-butylphenyl)-5-(4"-biphenyl)-1,3,4-oxadiazole, 2,5-bis(1-naphthyl)-1,3,4-oxadiazole, 1,4-bis[2-(5-phenyloxadiazoly)]benzene, 1,4-bis[2-(5-phenyloxadiazolyl)-4-tert-butylbenzene], 2-(4'-tert-butylphenyl)-5-(4"-biphenyl)-1,3,4-thiadiazole, 2,5-bis(1-naphthyl)-1,3,4-thiadiazole, 1,4-bis[2-(5-phenylthiadiazolyl)]benzene, 2-(4'-tert-butylphenyl)-5-(4"-biphenyl)-1,3,4-triazole, 2,5-bis(1-naphthyl)-1,3,4-triazole, and 1,4-bis[2-(5-phenyltriazolyl)]benzene.

As materials used for these light-emitting layer and each functional layer, materials having a polymerizable group such as a vinyl group in the molecule are used and may be formed as a cross-linked/polymerized film after film formation.

Incidentally, as a conductive material used for the anode layer, those having a work function of more than 4 eV are suitable. Silver, gold, platinum, palladium, and alloys thereof; metal oxides such as tin oxide, indium oxide, or ITO; and organic conductive resins such as polythiophene or polypyrrole are used.

Further, as a conductive material used for the cathode layer, those having a work function of less than 4 eV are suitable. Magnesium and aluminum as metal and magnesium/silver and lithium/aluminum as alloys are cited as typical examples.

<Substrate>

Next, a substrate used for an organic EL element will be described.

As a substrate material for the substrate used in the present invention, any appropriate substrate exhibiting optical transparency is employable, including a glass substrate and a plastic substrate with no limitation thereto.

The plastic (resin) substrate includes a transparent resin film. Those having a thickness of about 100 μm to 2 mm are used. The transparent resin film includes polyethylene, polyethylene naphthalate (PEN), polyethylene terephthalate (PET), ethylene-vinyl acetate copolymers, ethylene-vinyl alcohol copolymers, polymethyl methacrylate, polyether ether ketone, polyether sulfone, tetrafluoroethylene-perfluoroalkyl vinyl ether copolymers, polyester, polycarbonate, polyurethane, polyimide, and polyetherimide with no limitation thereto. Of these, polyethylene naphthalate (PEN) is preferable.

A substrate made of polyethylene naphthalate is preferable because of its small deformation amount in heating.

Further, a gas barrier film exhibiting enhanced gas barrier performance may be used. The gas barrier film includes films with a gas barrier film of a thickness of 50 nm to 50 μm having a sealing function such as oxide films of metal, e.g., oxide nitride films thereof, nitride films of metal, and metal thin films.

<Forming Method for Organic EL Element>

The forming method for an organic functional layer formed on the substrate is not also specifically limited. A forming method employing any one of a vapor deposition method and a coating method may be used.

<Bonding>

The surface where an organic functional layer of an organic EL element formed in the above manner has been formed and the surface where an adhesive layer of the sealing substrate has been formed are bonded together so as to face each other to form a sealed organic EL panel Herein, in the present invention, the sealed structure formed via bonding may be a sealed can-type hollow structure or a contact sealed structure in which a tightly sealed-type sealing adhesive is filled.

<Bonding Step>

In the present invention, the step of forming a heat-durable adhesive layer on a sealing substrate and the following curing/heating step for an adhesive layer are not required to be continuous and may be discontinuous. However, the curing/heating step for an adhesive layer and the step of bonding to an organic EL element are preferably performed continuously.

Herein, "continuity" referred to in the present invention means that the interval between the curing/heating step of an adhesive layer and the step of bonding to an organic EL element falls within the range of several minutes to several hours, practically referring to the range where no moisture is absorbed from the environmental ambience.

As the environment of the curing-heating step, inert gas ambience is preferable. With an inert gas ambience, in a heat-curable adhesive layer, oxidation reaction or thermal polymerization reaction is not promoted. In addition, an organic EL element is more preferably present in the same ambience since no damage is caused to the forming material of the organic EL element.

Further, as the environment of the curing/heating step, an environment of a dew point of at most −30° C. is preferable but at most −60° C. is specifically preferable. With respect to the atmospheric pressure, the environment is preferably at most 1,000 Pa.

Still further, the heating step and the bonding step are most preferably arranged as a continuous step in the same space.

When in such an environment, a heat-curable adhesive layer as the sealing member is heated for bonding to an organic EL element, in the present invention, the curing degree of the adhesive of the heat-curable adhesive layer is allowed to be preferably at most 50%.

In the present invention, in the preheating step for the adhesive layer, the curing degree of the adhesive is preferably at most 50%. When the curing degree exceeds 50%, the adhesion function in the following bonding to an organic EL element substrate becomes inadequate and then the adhesive layer is unable to plastically deform conforming to the shape of the element, resulting in the possibility of damage to the element.

It has been conventionally thought that heating is difficult to carry out in the case of sealing and adhesion using a heat-curable adhesive. However, in the manufacturing method of the present invention, it was found that with management of curing degree, using a simple method, the moisture content of a heat-curable adhesive layer was allowed to decrease and thereby an enhanced sealing effect could be realized.

EXAMPLES

The present invention will now specifically be described with reference to examples that by no means limit the scope of the present invention. Herein, the expression of "parts" or "%" used in the examples refers to "parts by mass" or "% by mass" unless otherwise specifically specified.

Example 1

Production of Organic EL Element

On the basis of the following method, a sheet-shaped organic EL element configured similarly to the one described in FIGS. 1a and 1b was produced.

(Production of Transparent Supporting Substrate)

In the center of a polyethylene naphthalate (PEN) film substrate of a width size of 100 mm×100 mm and a thickness of 100 μm, using ITO (indium tin oxide) of a width size of 80 mm×80 mm and a thickness of 100 nm as the anode, a transparent anode substrate, in which partially, an anode taking-out portion was patterned, was prepared. This substrate was ultrasonically cleaned with isopropyl alcohol and dried using dried nitrogen, further followed by UV ozone cleaning for 5 minutes.

(Formation of Hole Transporting Layer)

On this transparent supporting substrate, a hole transporting layer of a film thickness of 30 nm was formed in which a solution where poly(3,4-ethylenedioxythiophene)-polystyrene sulfonate (PEDOT/PSS, Baytron P AI 4083, produced by Bayer AG) was dissolved at 70% with pure water was coated on the anode at a width size of 80 mm×80 mm using a screen printing method, followed by 1-hour drying at 200° C.

(Formation of Light-Emitting Layer)

Subsequently, using a screen printing method, a light-emitting layer composition composed below was coated in the center of a substrate of a width size of 100 mm×100 mm at a width size of 90 mm×90 mm to form a light-emitting layer of a film thickness of about 25 nm.

<Light-Emitting Layer Composition>

| Solvent: toluene | 100% by mass |
|---|---|
| Host material: H—A | 1% by mass |
| Blue material: Ir—A | 0.10% by mass |
| Green material: Ir(ppy)$_3$ | 0.004% by mass |
| Red material: Ir(piq)$_3$ | 0.005% by mass |

(Formation of Electron Transporting Layer)

Then, using a screen printing method, the following electron transporting layer coating liquid was coated on the light-emitting layer at a width size of 90 mm×90 mm to provide an electron transporting layer of a film thickness of 20 nm.

<Electron Transporting Layer Coating Liquid>

| 2,2,3,3-Tetrafluoro-1-propanol | 100 ml |
|---|---|
| ET-A | 0.50 g |

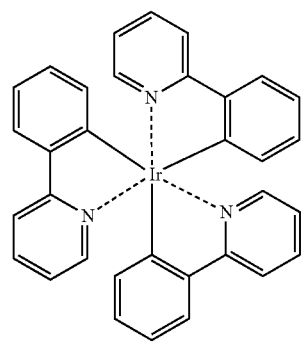

Ir(ppy)$_3$

Ir(piq)$_3$

H-A

Ir-A

-continued

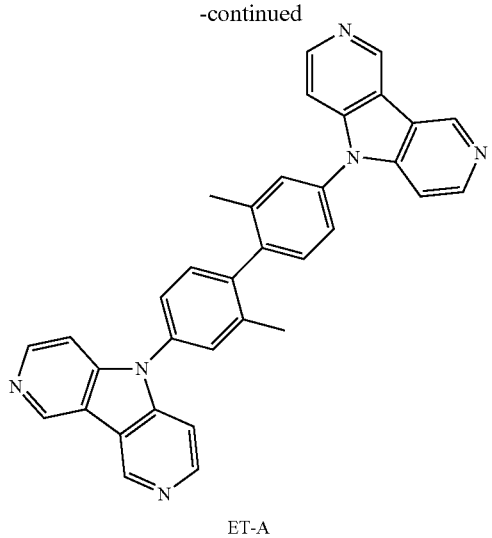

ET-A (Formation of Cathode Buffer Layer and Cathode)

Further, the above sample in which an electron transporting layer had been formed was transferred to a vacuum deposition apparatus and then a vacuum tank was depressurized down to $4\times10^4$ Pa. Then, using a mask of a width size of 90 mm×90 mm partially having a cathode taking-out portion, on the electron transporting layer, a lithium fluoride film as the cathode buffer layer and an aluminum film as the cathode were sequentially formed via vapor deposition at thicknesses of 10 nm and 110 nm, respectively, to produce an organic EL element.

<Production of Sealing Substrate>

Using aluminum foil (produced by Toyo Aluminium KK.) of a thickness of 50 μm, on the matte surface thereof, polyethylene terephthalate (PET) film of a thickness of 12 μm was laminated using an adhesive for dry lamination (a two liquid reactive type urethane adhesive) (the thickness of the adhesive layer: 1.5 μm) to produce a sealing substrate.

<Formation of Heat-Curable Adhesive Layer>

The above-produced sealing substrate (PET-laminated aluminum foil) was cut to 100 mm×100 mm and then on the glossy surface thereof (the aluminum surface), a heat-curable adhesive layer was formed with the following constituent materials using a dispenser to give an adhesive-provided sealing substrate.

(Heat-Curable Adhesive Layer Constituent Materials)

| | |
|---|---|
| Bisphenol A diglycidyl ether (DGEBA) | 100% by mass |
| Dicyandiamide (DICY) | 8% by mass |
| Epoxy-adduct-based curing promoter | 3% by mass |

<Production of Organic EL Panel 101>

The adhesive layer surface of the thus-obtained adhesive-provided sealing substrate was brought into close contact and arranged on a polyethylene naphthalate (PEN) film substrate in which an organic EL element had been formed under $N_2$ ambience (dew point: −50° C.), and thereby the sealing substrate was pressure-bonded (pressure: 0.15 MPa, time: 30 seconds) for temporary adhesion. Cuing/heating was carried out from the substrate side of the temporarily adhered organic EL panel and the substrate side of the sealing substrate using a heating plate (temperature: 80° C., time: 30 minutes) and thereby a heat-curable adhesive layer was cured to produce organic EL panel 101.

<Production of Organic EL Panels 102-108>

Organic EL panels 102-108 were produced in the same manner as in production above organic EL panel 101 except that preheating for the heat-curable adhesive layer of the sealing substrate was added and the heating conditions (temperature and time) and heating ambience ($N_2$ ambient dew point and vacuum degree) of the preheating treatment were changed to conditions shown in Table 1.

Herein, the preheating treatment was carried out as follows.

<Preheating of Sealing Substrate>

The above-obtained sealing substrate having an adhesive layer was preheated under the following conditions. Further, at the same time, the curing degree and the moisture content associated with preheating was determined using the following devices.

(Preheating)

At a location of 100 mm distant from the adhesive layer side of a sealing member, preheating was carried out using a far-infrared plate heater (BD3040, 2 kW, produced by Denko Co. Ltd.).

(Determination of Moisture Content)

The moisture contents of the above-formed sealing member prior to and after preheating were determined using a Karl Fischer moisture meter (CA-200, produced by Mitsubishi Chemical Analytech Co., Ltd.).

(Determination of Curing Degree of Heat-Curable Resin)

Using an FT-IR device (FT5-40, produced by Bio-Rad Laboratories, Inc.), changes of the peak intensity at 930 nm were determined. The value of the peak intensity prior to curing reaction and the value of the peak intensity after curing reaction were determined in advance and then the values each were designated as 0 and 100 for curing degree evaluation.

<<Evaluations of Organic EL Panels>>

With regard to above-produced organic EL panels 101-108, close contact degree and the generated number of dark spots were evaluated based on the following methods. The thus-obtained results are shown in Table 1.

(Close Contact Degree)

Each of produced organic EL panels 101-108 was bended at bending radii of 50 mm and 100 mm so as for the sealing substrate side to become convex to visually confirm the close contact degree (peeling) of the sealing substrate.

[Close Contact State Evaluation Ranking]

A: No sealing member is peeled at 50 mm.

B: No sealing member is peeled at 100 mm but peeling is noted at 50 mm.

C: A sealing member is peeled at 100 mm.

(The Generated Number of Dark Spots)

A produced organic EL panel was allowed to stand for 3 hours in an ambience of a dew point of −80° C. and a temperature of 70° C. and then applied with a voltage of +5 V using a low voltage power source (DC Voltage/Current Generator R6243, produced by ADC Corp.) for element luminescence and thereby the luminescent state at the moment was observed using a microscope. Then, the generated number of dark spots (DSs) of a diameter of at least 30 μm was counted.

[DS Generation Evaluation Ranking]

A: 0

B: 1 to less than 10

C: 10 to less than 20

D: at least 20

TABLE 1

| No. | Temperature (° C.) | Time (sec) | Dew Point (° C.) | Vacuum Degree (Pa) | Curing Degree (%) | Moisture Content (ppm) | Close Contact Degree | DS Generation Evaluation | Remarks |
|---|---|---|---|---|---|---|---|---|---|
| 101 | — | — | — | — | 0 | 2,000< | A | D | Comparative |
| 102 | 90 | 20 | −20 | 100,000 (*) | 10 | 500 | A | C | Inventive |
| 103 | 100 | 20 | −30 | 100,000 (*) | 15 | 300 | A | B | Inventive |
| 104 | 90 | 20 | −20 | 1,000 | 10 | 300 | A | B | Inventive |
| 105 | 90 | 20 | −30 | 1,000 | 10 | 200 | A | B | Inventive |
| 106 | 130 | 20 | −20 | 100,000 (*) | 30 | 200 | A | B | Inventive |
| 107 | 150 | 150 | −20 | 100,000 (*) | 50 | 100 | A | A | Inventive |
| 108 | 160 | 150 | −20 | 100,000 (*) | 55 | <100 | B | A | Inventive |

(*): Atmospheric pressure

The results described in Table 1 clearly show that the organic EL panel of the present invention, in which a heat-curable adhesive layer is preheated and dehydrated and thereafter an organic EL element is bonded thereto, followed by curing/heating for sealing, has a minimal generated number of dark spots (DSs) and is well dried. Further, it is shown that when the curing degree exceeds 50%, the close contact degree of a film substrate where an organic EL element is formed and a sealing substrate decreases.

Example 2

On the basis of the following method, a roll-shaped organic EL element substrate in which organic EL elements configured as illustrated in FIGS. 2a-2e were continuously formed was produced.

(Production of Substrate Having Transparent Electrode)

On a roll film substrate of polyethylene naphthalate (PEN) of a width size of 100 mm×10 m and a thickness of 100 μm, a transparent electrode substrate, in which as the anode, ITO (indium tin oxide) of a width size of 80 mm×80 mm and a thickness of 100 nm was used at electrode intervals of 20 mm and an anode taking-out portion was patterned, was prepared.

(Formation of Hole Transporting Layer)

On this transparent electrode substrate, a solution in which poly(3,4-ethylenedioxythiophene)-polystyrene sulfonate (PEDOT/PSS, Baytron P AI 4083, produced by Bayer AG) was dissolved at 70% with pure water was coated at a width size of 80 mm×80 mm and intervals of 20 mm using an ink-jet printing method, followed by 1-hour drying at 200° C. to form a hole transporting layer of a film thickness of 30 nm.

(Formation of Light-Emitting Layer)

Subsequently, using an extrusion method, a light-emitting layer composition composed below was coated in the center of a substrate of a width size of 100 mm×100 mm at a width of 90 mm to form a light-emitting layer of a film thickness of about 25 nm.

<Light-Emitting Layer Composition>

| Solvent: toluene | 100% by mass |
|---|---|
| Host material: H—A | 1% by mass |
| Blue material: Ir—A | 0.10% by mass |
| Green material: Ir(ppy)$_3$ | 0.004% by mass |
| Red material: Ir(piq)$_3$ | 0.005% by mass |

Then, using an extrusion method, the following electron transporting layer coating liquid was coated on the light-emitting layer at a width of 90 mm to provide an electron transporting layer of a film thickness of 20 nm to be wound as a roll.

<Electron Transporting Layer Coating Liquid>

| 2,2,3,3-Tetrafluoro-1-propanol | 100 ml |
|---|---|
| ET-A | 0.50 g |

The used compounds are the same as in Example 1.

(Formation of Cathode Buffer Layer and Cathode)

The above-obtained roll-shaped sample in which formation was carried out up to the electron transporting layer was wound and transferred to a vacuum deposition apparatus equipped with a winding-out section, and then a vacuum tank was depressurized down to $4\times10^{-4}$ Pa. Then, using a mask of a width size of 90 mm×90 mm partially having a cathode taking-out portion, on the electron transporting layer, a lithium fluoride film as the cathode buffer layer and an aluminum film as the cathode each were sequentially formed via vapor deposition at thicknesses of 10 nm and 110 nm to produce organic EL element substrates continuing in a roll-shaped manner.

<Production of Roll-Shaped Sealing Substrate>

Using aluminum foil (produced by Toyo Aluminium KK) of a thickness of 50 μm, on the matte surface thereof, polyethylene terephthalate (PET) film of a thickness of 12 μm and a size of 90 mm wide×10 long was laminated using an adhesive for dry lamination (a two liquid reactive type urethane adhesive) (the thickness of the adhesive layer: 1.5 μm) to produce a roll-shaped sealing substrate.

<Formation of Heat-Curable Adhesive Layer>

The above-produced roll-shaped sealing substrate (PET-laminated aluminum foil) was wound out and then on the glossy surface thereof (the aluminum surface), a heat-curable adhesive layer was formed with the following heat-curable adhesive layer constituent materials using an extrusion method, followed by being wound.

(Heat-Curable Adhesive Layer Constituent Materials)

| Bisphenol A diglycidyl ether (DGEBA) | 100% by mass |
|---|---|
| Dicyandiamide (DICY) | 8% by mass |
| Epoxy-adduct-based curing promoter | 3% by mass |

<Production of Organic EL Panel 201>

The adhesive layer surface of the thus-obtained roll-shaped sealing substrate and the organic EL element side of a polyethylene naphthalate (PEN) film substrate (organic EL element substrate) in which an organic EL element was formed in a roll-shaped manner were brought into contact and arranged together under $N_2$ ambience (dew point: −50° C.) via roll conveyance as shown in FIGS. 3a-3e and thereby the sealing substrate was pressure-bonded (pressure: 0.3 MPa, conveyance rate: 0.5 m/min) using a roll laminate method for temporary adhesion. Cuing/heating was carried out from the substrate side of the temporarily adhered organic EL panel and the sealing substrate side using a heating plate (temperature: 80° C., time: 30 minutes) and thereby a heat-curable adhesive layer was cured, followed by cutting to produce organic EL panel 201.

<Production of Organic EL Panels 202-206>

Organic EL panels 202-206 were produced in the same manner as in production above organic EL panel 201 except that preheating for the heat-curable adhesive layer of the sealing substrate was added and the heating conditions (temperature and time) for the preheating treatment were changed to conditions shown in Table 2.

Herein, the preheating treatment was carried out as follows.

<Preheating of Sealing Substrate>

The above-obtained roll-shaped sealing substrate (a sealing member) having an adhesive layer was preheated under the following conditions. Further, at the same time, the curing degree and the moisture content associated with preheating was determined using the following devices.

(Preheating)

At a location of 50 mm distant from the adhesive layer side of a sealing member, preheating was carried out using a far-infrared plate heater (BD3040, 2 kW, produced by Denko Co. Ltd.). The heating was carried out under $N_2$ ambience (dew-point: −50° C.) for the organic EL element and the adhesive layer side in the same space as for the close contact/arrangement step.

(Determination of Moisture Content)

The moisture contents of the formed sealing member without and after preheating were determined using a Karl Fischer moisture meter (CA-200, produced by Mitsubishi Chemical Analytech Co., Ltd.).

(Determination of Curing Degree)

Using an FT-IR device (FT5-40, produced by Bio-Rad Laboratories, Inc.), changes of the peak intensity at 930 nm were determined. The value of the peak intensity prior to curing reaction and the value of the peak intensity after curing reaction were determined in advance and then the values each were designated as 0 and 100 for curing degree evaluation.

<<Evaluations of Organic EL Panels>>

Above-produced organic EL panels 201-206 were evaluated in the same manner as in Example 1.

The thus-obtained results are shown in Table 2.

where an organic EL element is formed and a sealing substrate decreases.

DESCRIPTION OF THE SYMBOLS 1, 11: substrate
2, 12: first electrode
2a: first electrode lead portion
3: hole transporting layer
4: light-emitting layer
5: second electrode
5a: second electrode lead portion
10, 30: organic EL element
12, 22: adhesive coating apparatus
13, 23: adhesive layer
14, 24: preheating device
15, 25: moisture measurement device
16, 26: infrared absorption measurement device
19, 29: present heater
20: sealing substrate roll
21: sealing substrate
27: laminate roll
28: sealing substrate with an adhesive layer formed thereon
40: organic EL panel

The invention claimed is:

1. A manufacturing method for an organic electroluminescent panel, the organic electroluminescent panel comprising an organic electroluminescent element including at least a first electrode, an organic functional layer containing a light-emitting layer, and a second electrode on a substrate; and a sealing substrate having a heat-curable adhesive layer formed thereon, the organic electroluminescent element and the sealing substrate being bonded and arranged via the heat-curable adhesive layer, wherein the manufacturing method comprises, in this order:
preheating the heat-curable adhesive layer;
bonding the preheated heat-curable adhesive layer and the organic electroluminescent element; and
curing and heating the preheated heat-curable adhesive layer;
wherein, in the preheating, a curing degree of the heat-curable adhesive layer after preheating is at most 50%, and the preheating and the bonding are performed in a same space and are continuously performed.

TABLE 2

| No. | Temperature (° C.) | Time (sec) | Curing Degree (%) | Moisture Content (ppm) | Close Contact Degree | DS Generation Evaluation | Remarks |
|---|---|---|---|---|---|---|---|
| 201 | — | — | 0 | 2,000< | A | D | Comparative |
| 202 | 90 | 20 | 10 | 500 | A | C | Inventive |
| 203 | 100 | 20 | 15 | 300 | A | B | Inventive |
| 204 | 130 | 20 | 30 | 200 | A | B | Inventive |
| 205 | 150 | 150 | 50 | 100 | A | A | Inventive |
| 206 | 160 | 150 | 55 | <100 | B | A | Inventive |

The results described in Table 2 clearly show that the organic EL panel of the present invention, in which a heat-curable adhesive layer is preheated and dehydrated and thereafter an organic EL element is bonded thereto, followed by being thermally cured via curing/heating treatment for sealing, has a minimal generated number of dark spots (DSs) and is well dried. Further, it is shown that when the curing degree exceeds 50%, the close contact degree of a film substrate 2. The manufacturing method of claim 1, wherein, in the preheating, a moisture content of the heat-curable adhesive layer after preheating is at most 500 ppm.

3. The manufacturing method of claim 1, wherein, in the preheating, a moisture content of the heat-curable adhesive layer prior to preheating is at least 2,000 ppm.

4. The manufacturing method of claim 1, wherein the preheating is performed in an inert gas environment.

5. The manufacturing method of claim 1, wherein the preheating is performed at a dew point of at most −30° C.

6. The manufacturing method of claim 1, wherein the preheating is performed at 1,000 Pa or less.

7. The manufacturing method of claim 1, wherein:
the substrate is a belt-shaped flexible substrate; and
the preheating of the heat-curable adhesive layer, the bonding of the preheated heat-curable adhesive layer and the organic electroluminescent element, and the thermally curing the preheated heat-curable adhesive layer are performed using a continuous roll-to-roll system.

8. An organic electroluminescent panel formed by the manufacturing method of claim 1.

* * * * *